the(12) United States Patent
Do et al.

(10) Patent No.: US 9,293,204 B2
(45) Date of Patent: Mar. 22, 2016

(54) NON-VOLATILE MEMORY CELL WITH SELF ALIGNED FLOATING AND ERASE GATES, AND METHOD OF MAKING SAME

(71) Applicant: Silicon Storage Technology, Inc., San Jose, CA (US)

(72) Inventors: Nhan Do, Saratoga, CA (US); Jinho Kim, Saratoga, CA (US); Xian Liu, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 55 days.

(21) Appl. No.: 14/252,929

(22) Filed: Apr. 15, 2014

(65) Prior Publication Data
US 2014/0307511 A1 Oct. 16, 2014

Related U.S. Application Data

(60) Provisional application No. 61/812,685, filed on Apr. 16, 2013.

(51) Int. Cl.
| | |
|---|---|
| *H01L 29/788* | (2006.01) |
| *H01L 27/115* | (2006.01) |
| *G11C 16/04* | (2006.01) |
| *G11C 16/14* | (2006.01) |
| *H01L 29/66* | (2006.01) |
| *H01L 29/423* | (2006.01) |

(52) U.S. Cl.
CPC ............ *G11C 16/14* (2013.01); *G11C 16/0416* (2013.01); *H01L 27/11521* (2013.01); *H01L 27/11553* (2013.01); *H01L 29/42328* (2013.01); *H01L 29/42336* (2013.01); *H01L 29/66825* (2013.01); *H01L 29/7889* (2013.01)

(58) Field of Classification Search
CPC ................... H01L 27/11517; H01L 27/11521; H01L 29/7831; H01L 29/7889; H01L 29/66825; H01L 29/42324; H01L 29/42328; H01L 29/42336
See application file for complete search history.

(56) References Cited

U.S. PATENT DOCUMENTS

| | | | | |
|---|---|---|---|---|
| 5,338,953 | A | * 8/1994 | Wake | ................ H01L 27/11517 257/316 |
| 5,467,305 | A | * 11/1995 | Bertin | ................... H01L 27/115 257/298 |
| 5,780,341 | A | 7/1998 | Ogura | |
| 6,891,220 | B2 | 5/2005 | Yeh et al. | |

(Continued)

OTHER PUBLICATIONS

PCT Search Report dated Jul. 25, 2014 corresponding to the related PCT Patent Application No. US2014/034318.

*Primary Examiner* — Allison P Bernstein
(74) *Attorney, Agent, or Firm* — DLA Piper LLP (US)

(57) ABSTRACT

A memory device, and method of making the same, in which a trench is formed into a substrate of semiconductor material. The source region is formed under the trench, and the channel region between the source and drain regions includes a first portion that extends substantially along a sidewall of the trench and a second portion that extends substantially along the surface of the substrate. The floating gate is disposed in the trench, and is insulated from the channel region first portion for controlling its conductivity. A control gate is disposed over and insulated from the channel region second portion, for controlling its conductivity. An erase gate is disposed at least partially over and insulated from the floating gate. An electrically conductive coupling gate is disposed in the trench, adjacent to and insulated from the floating gate, and over and insulated from the source region.

22 Claims, 7 Drawing Sheets

(56) References Cited

U.S. PATENT DOCUMENTS

| | | | |
|---|---|---|---|
| 6,906,379 B2* | 6/2005 | Chen | H01L 27/115 257/314 |
| 7,598,561 B2* | 10/2009 | Chen | H01L 29/7885 257/314 |
| 7,851,846 B2 | 12/2010 | Do | |
| 8,008,702 B2* | 8/2011 | Wang | H01L 27/11521 257/314 |
| 8,148,768 B2* | 4/2012 | Do | H01L 21/28273 257/204 |
| 2009/0098721 A1* | 4/2009 | Liu | H01L 27/11521 438/593 |
| 2010/0133602 A1 | 6/2010 | Do | |
| 2015/0179749 A1* | 6/2015 | Chen | G11C 16/10 365/185.18 |

* cited by examiner

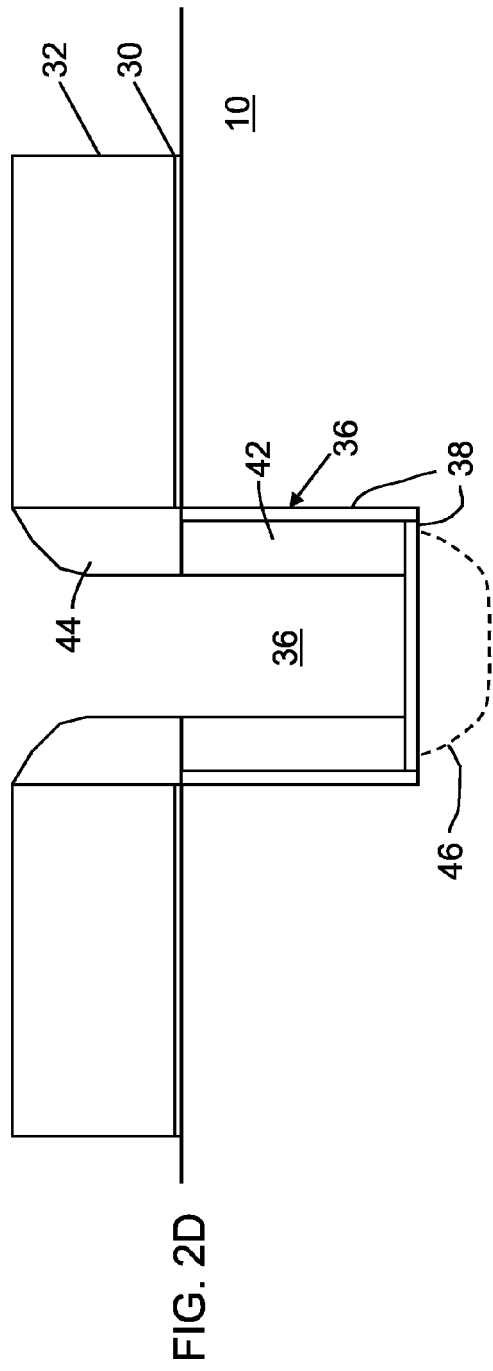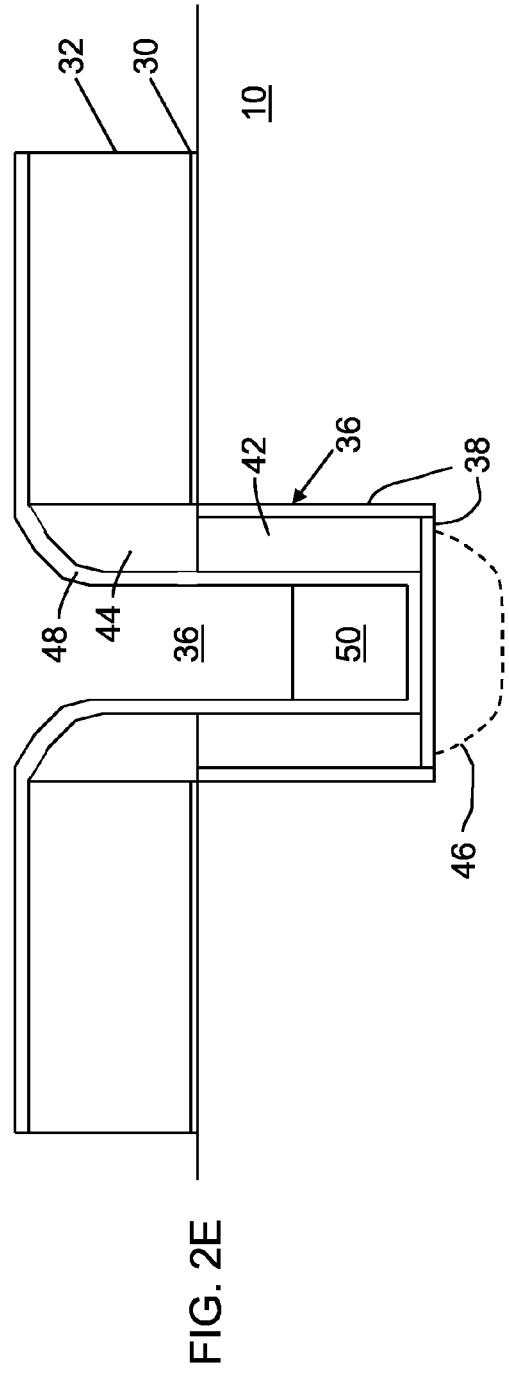

NON-VOLATILE MEMORY CELL WITH SELF ALIGNED FLOATING AND ERASE GATES, AND METHOD OF MAKING SAME

RELATED APPLICATIONS

This application claims the benefit of U.S. Provisional Application No. 61/812,685, filed Apr. 16, 2013, and which is incorporated herein by reference.

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer, while not sacrificing performance (i.e. program, erase and read efficiencies and reliabilities). It is well known that forming memory cells in pairs, with each pair sharing a single source region, and with adjacent pairs of cells sharing a common drain region, reduces the size of the memory cell array. It is also known to form trenches into the substrate, and locate one or more memory cell elements in the trench to increase the number of memory cells that fit into a given unit surface area (see for example U.S. Pat. Nos. 5,780, 341 and 6,891,220). However, such memory cells use the control gate to both control the channel region (in a low voltage operation) and to erase the floating gate (in a high voltage operation). This means the control gate is both a low voltage and high voltage element, making it difficult to surround it with sufficient insulation for high voltage operation while not being too electrically isolated for low voltage operation. Moreover, the proximity of the control gate to the floating gate needed for an erase operation can result in unwanted levels of capacitive coupling between the control gate and the floating gate.

U.S. Pat. No. 8,148,768 discloses a memory device and method of making same, in which a trench is formed into a substrate 10 of semiconductor material. The source region 46 is formed under the trench, and the channel region 72 between the source and drain regions includes a first portion 72a that extends substantially along a sidewall of the trench and a second portion 72b that extends substantially along the surface of the substrate. The floating gate 42 is disposed in the trench, and is insulated from the channel region first portion 72a for controlling its conductivity. The control gate 62 is disposed over and insulated from the channel region second portion 72b, for controlling its conductivity. The erase gate 58 is disposed at least partially over and insulated from the floating gate 42. The erase gate 58 includes a notch 80, and the floating gate includes an edge 42a that directly faces and is insulated from the notch 80. Poly block 50 is formed at the bottom of the trench, and in electrical contact with source region 46, to provide the same voltage of source region 46 to poly block 50. Poly blocks 50 each extend along and are insulated from floating gates 42, for enhanced voltage coupling therebetween which is critical for programming and erasing the memory cell.

As the dimensions of the above described cell become smaller and smaller, several issues arise. First, there is a low source junction breakdown, which limits the program-disturb window. Second, the source voltage must be high enough to avoid programming disturb, which means the programming window is limited.

Thus it is an object of the present invention to create a memory cell configuration and method of manufacture that addresses these issues.

SUMMARY OF THE INVENTION

A pair of memory cells, comprising:
a substrate of semiconductor material having a first conductivity type and a surface;
a trench formed into the surface of the substrate and including a pair of opposing sidewalls;
a first region formed in the substrate under the trench;
a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface;
a pair of electrically conductive floating gates each at least partially disposed in the trench adjacent to and insulated from one of the channel region first portions for controlling a conductivity of the one channel region first portion, and over and insulated from the first region;
an electrically conductive erase gate having a lower portion disposed in the trench and disposed adjacent to and insulated from the floating gates;
an electrically conductive coupling gate disposed in the trench, disposed between and insulated from the floating gates, disposed over and insulated from the first region, and disposed under and insulated from the erase gate; and
a pair of electrically conductive control gates each disposed over and insulated from one of the channel region second portions for controlling a conductivity of the one channel region second portion.

A method of forming a pair of memory cells, comprising:
forming a trench into a surface of the semiconductor substrate of first conductivity type, wherein the trench has a pair of opposing sidewalls;
forming a first region in the substrate and under the trench;

forming a pair of second regions in the substrate, with a pair of channel regions each defined in the substrate between the first region and one of the second regions, wherein the first and second regions have a second conductivity type, and wherein each of the channel regions includes a first portion that extends substantially along one of the opposing trench sidewalls and a second portion that extends substantially along the surface of the substrate;

forming a pair of electrically conductive floating gates each at least partially disposed in the trench adjacent to and insulated from one of the channel region first portions for controlling a conductivity of the one channel region first portion;

forming an electrically conductive erase gate having a lower portion disposed in the trench and disposed adjacent to and insulated from the floating gates;

forming an electrically conductive coupling gate disposed in the trench, disposed between and insulated from the floating gates, disposed over and insulated from the first region, and disposed under and insulated from the erase gate; and forming a pair of electrically conductive control gates each disposed over and insulated from one of the channel region second portions for controlling a conductivity of the one channel region second portion.

A method of programming one of a pair of memory cells, whereby the pair of memory cells comprise a substrate of semiconductor material having a first conductivity type and a surface, a trench formed into the surface of the substrate and including a pair of opposing sidewalls, a first region formed in the substrate under the trench, a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each at least partially disposed in the trench adjacent to and insulated from one of the channel region first portions for controlling a conductivity of the one channel region first portion, an electrically conductive erase gate having a lower portion disposed in the trench and disposed adjacent to and insulated from the floating gates, an electrically conductive coupling gate disposed in the trench, disposed between and insulated from the floating gates, disposed over and insulated from the first region, and disposed under and insulated from the erase gate, and a pair of electrically conductive control gates each disposed over and insulated from one of the channel region second portions for controlling a conductivity of the one channel region second portion, the method comprising:

applying a positive voltage to one of the second regions;
applying a positive voltage to one of the control gates;
applying a positive voltage to the first region;
applying a positive voltage to the coupling gate; and
applying a positive voltage to the erase gate;

wherein the positive voltage applied to the first region is different from the positive voltage applied to the coupling gate.

A method of erasing a pair of memory cells, whereby the pair of memory cells comprise a substrate of semiconductor material having a first conductivity type and a surface, a trench formed into the surface of the substrate and including a pair of opposing sidewalls, a first region formed in the substrate under the trench, a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each at least partially disposed in the trench adjacent to and insulated from one of the channel region first portions for controlling a conductivity of the one channel region first portion, an electrically conductive erase gate having a lower portion disposed in the trench and disposed adjacent to and insulated from the floating gates, an electrically conductive coupling gate disposed in the trench, disposed between and insulated from the floating gates, disposed over and insulated from the first region, and disposed under and insulated from the erase gate, and a pair of electrically conductive control gates each disposed over and insulated from one of the channel region second portions for controlling a conductivity of the one channel region second portion, the method comprising:

applying a negative voltage to the coupling gate; and
applying a positive voltage to the erase gate.

Other objects and features of the present invention will become apparent by a review of the specification, claims and appended figures.

BRIEF DESCRIPTION OF THE DRAWINGS

FIGS. 2A-2J are cross sectional views of the semiconductor structure in FIG. 1F taken along the line 2A-2A showing in sequence the steps in the processing of the semiconductor structure in the formation of a non-volatile memory array of floating gate memory cells of the present invention.

DETAILED DESCRIPTION OF THE PREFERRED EMBODIMENTS

It has been discovered that by forming an electrically isolated coupling gate inside the trench (for capacitive coupling to the floating gates), instead of a poly block electrically coupled to the source region, that the programming voltage is not limited by the source voltage breakdown. Specifically, the source region can be operated at a lower voltage (i.e. the coupling gate can be operated at a higher voltage) since the source region is electrically isolated from the coupling gate in the trench. It has also been discovered that having the thickness of the isolation layer between the coupling gate and the source be greater than that between the floating gate and source provides superior performance.

The method of the present invention is illustrated in FIGS. 1A to 1F and 2A to 2J (which show the processing steps in making the memory cell array of the present invention). The method begins with a semiconductor substrate 10, which is preferably of P type and is well known in the art. The thicknesses of the layers described below will depend upon the design rules and the process technology generation. What is described herein is for deep sub-micron technology process. However, it will be understood by those skilled in the art that the present invention is not limited to any specific process technology generation, nor to any specific value in any of the process parameters described hereinafter.

Isolation Region Formation

Figure 1A:
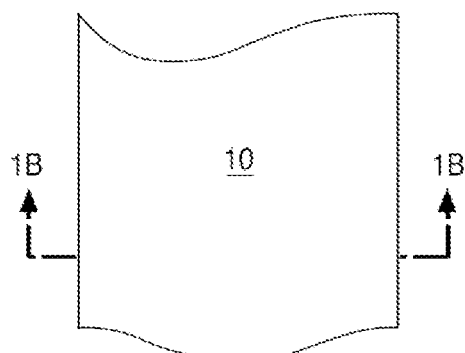
FIG. 1A is a top view of a semiconductor substrate used in the first step of the method of present invention to form isolation regions.
Figure 1B:
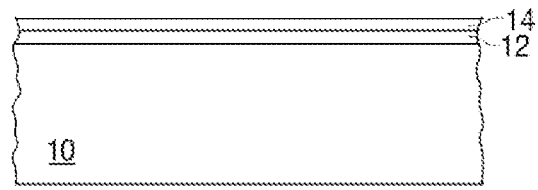
FIG. 1B is a cross sectional view of the structure taken along the line 1B-1B showing the initial processing steps of the present invention.

FIGS. 1A to 1F illustrate the well-known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well-known technique such as oxidation or oxide deposition (e.g. chemical vapor deposition or CVD) to a thickness of approximately 50-150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000-5000 Å. FIG. 1B illustrates a cross-section of the resulting structure.

Figure 1D:
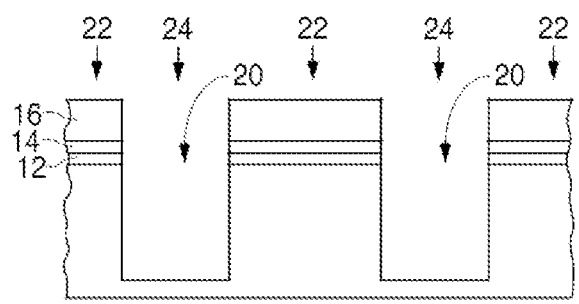
FIG. 1D is a cross sectional view of the structure in FIG. 1C taken along the line 1D-1D showing the isolation trenches formed in the structure.
Figure 1C:
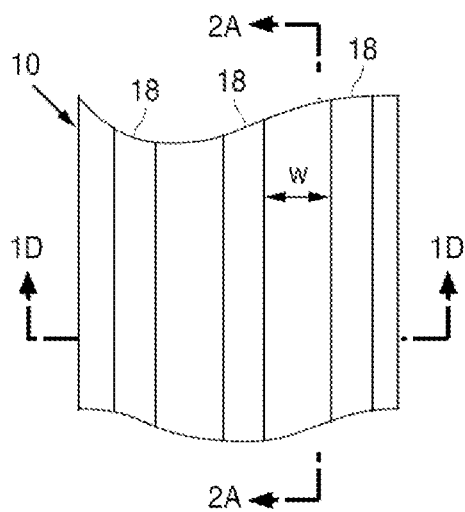
FIG. 1C is a top view of the structure showing the next step in the processing of the structure of FIG. 1B, in which isolation regions are defined.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
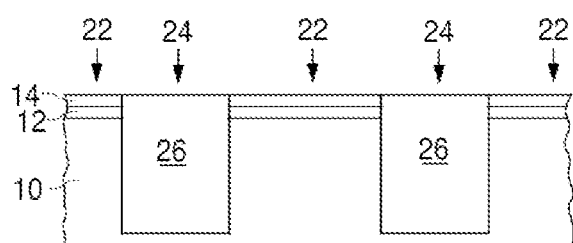
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well-known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region (not shown) in which control circuitry is formed that will be used to operate the memory cells formed in the memory cell array region. Preferably, isolation blocks 26 are also formed in the periphery region during the same STI or LOCOS process described above.

Memory Cell Formation

Figure 1F:
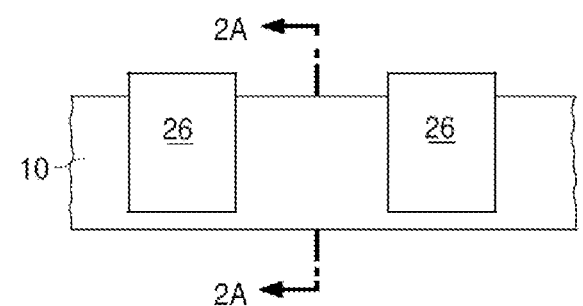
FIG. 1F is a cross sectional view of the structure in FIG. 1E showing the final structure of the isolation regions.

The structure shown in FIG. 1F is further processed as follows. FIGS. 2A to 2J show the cross sections of the structure in the active regions 22 from a view orthogonal to that of FIG. 1F (along line 2A-2A as shown in FIGS. 1C and 1F), as the next steps in the process of the present invention are performed concurrently in both regions.

Figure 2A:
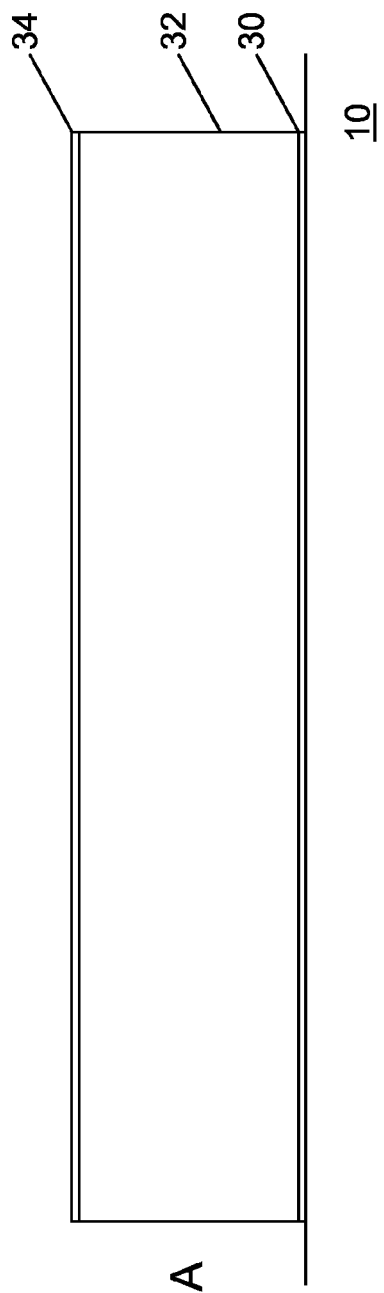
Figure 2B:
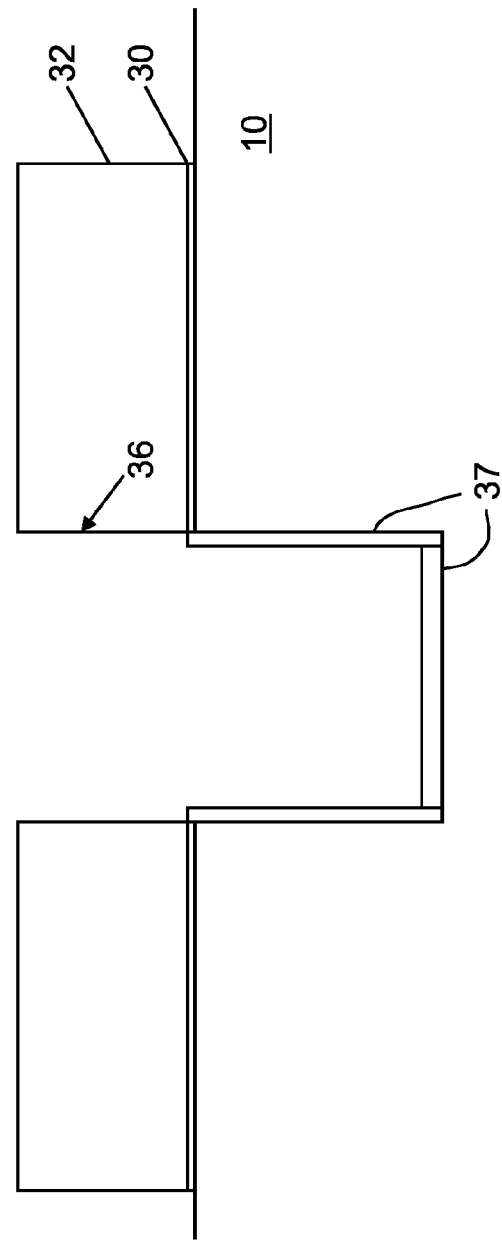

An insulation layer 30 (preferably oxide or nitrogen doped oxide) is first formed over the substrate 10 (e.g. ~10 to 50 Å thick). The active region portions of the substrate 10 can be doped at this time for better independent control of the cell array portion of the memory device relative to the periphery region. Such doping is often referred to as a $V_t$ implant or cell well implant, and is well known in the art. During this implant, the periphery region is protected by a photo resist layer, which is deposited over the entire structure and removed from just the memory cell array region of the substrate. Next, a thick layer of hard mask material 32 such as nitride is formed over oxide layer 30 (e.g. ~3500 Å thick). Then, an insulation layer 34 such as oxide is formed over the nitride layer 32. The resulting structure is shown in FIG. 2A.

A plurality of parallel second trenches 36 are formed in the oxide, nitride and oxide layers 34, 32, 30 by applying a photo resist (masking) material on the oxide layer 34, and then performing a masking step to remove the photo resist material from selected parallel stripe regions. Anisotropic oxide, nitride and oxide etches are used to remove the exposed portions of oxide, nitride and oxide layers 34, 32, 30 in the stripe regions, leaving second trenches 36 that extend down to and expose substrate 10. A silicon anisotropic etch process is then used to extend second trenches 36 down into the substrate 10 in each of the active regions 22 (for example, down to a depth of approximately one feature size deep, e.g. about 130 Å to several microns). The photo resist can be removed before or after trenches 36 are formed into the substrate 10.

An oxide etch is used to remove oxide 34. An optional sacrificial layer of insulation material 37 is next formed (preferably using a thermal oxidation or CVD oxide process) along the exposed silicon in second trenches 36 that forms the bottom wall and lower sidewalls of the second trenches 36. The formation of oxide 37 allows for the removal of damaged silicon by the oxidation step followed by oxide removal. An optional implant step is next performed to implant dopant in the substrate underneath trenches 36 (i.e. those portions of the substrate that will be underneath the floating gates to adjust the floating gate VT and/or prevent punch-though). Preferably, the implant is an angled implant. The resulting structure is shown FIG. 2B.

Figure 2C:
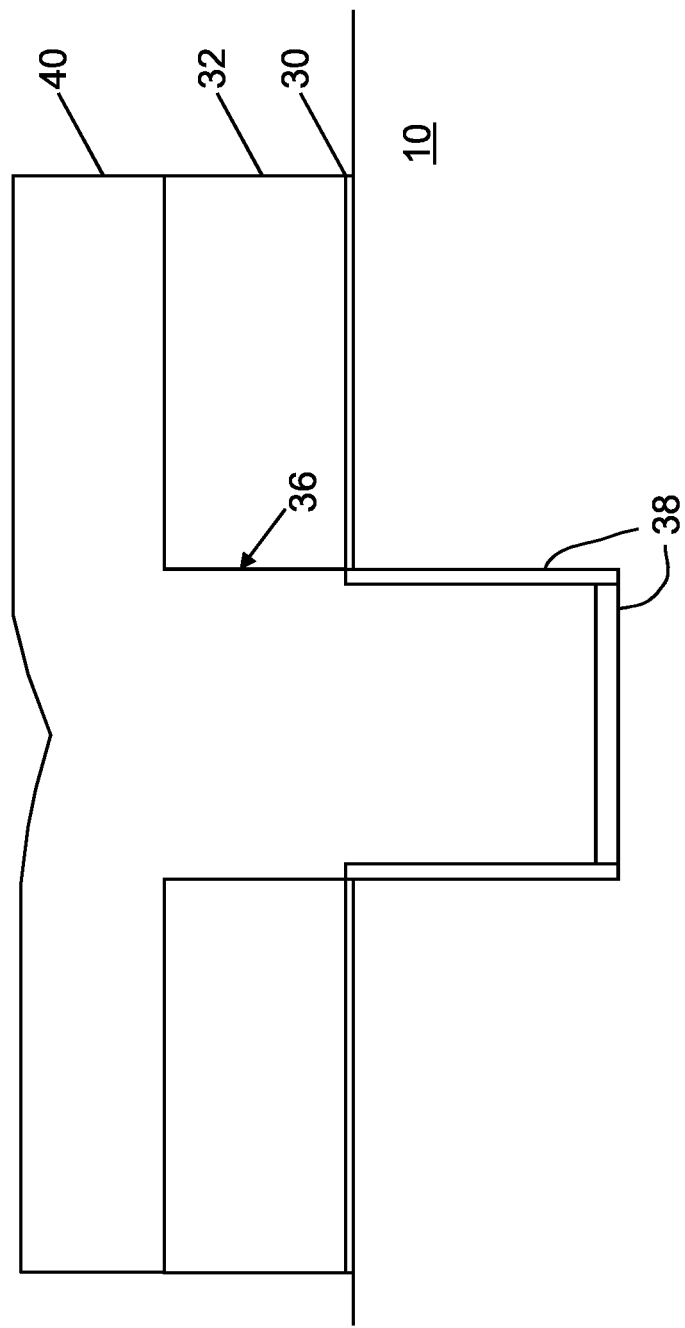

An oxide etch is performed to remove sacrificial oxide layer 37. A layer of oxide 38 is then formed (preferably using a thermal oxidation or CVD oxide process) along the exposed silicon in second trenches 36 that forms the bottom wall and lower sidewalls of the second trenches 36 (e.g. ~60 Å to 150 Å thick). A thick layer of polysilicon 40 (hereinafter "poly") is then formed over the structure, which fills second trenches 36. Poly layer 40 can be doped (e.g. n+) by ion implant, or by an in-situ phosphorus or arsenic doped poly process. An implant anneal process can be performed if the poly 40 is doped by ion implant. The resulting structure is shown in FIG. 2C.

A poly etch process (e.g. a CMP process using nitride layer 32 as an etch stop) is used to remove poly layer 40 except for blocks of the polysilicon layer 40 left remaining in second trenches 36. A controlled poly etch is then used to lower the height of poly blocks, where the tops of poly blocks are disposed approximately even with the surface of substrate 10. Oxide spacers 44 are then formed along the sidewalls of the second trenches 36. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 44 are formed by depositing oxide over the structure (e.g. approximately 300 to 1000 Å thickness) followed by an anisotropic oxide etch, which results in spacers 44 along the trench sidewalls, and partially covering the poly block. An anisotropic poly etch is then used to remove that exposed portion of the poly block, leaving a pair of poly blocks 42 each located under (and self-aligned to) one of the spacers 44.

Suitable ion implantation that, depending upon if the substrate is P or N type, may include arsenic, phosphorous, boron and/or antimony (and optional anneal), is then made across the surface of the structure to form first (source) regions 46 in the substrate portions at the bottom of second trenches 36, followed by an anneal of the implant. The source regions 46 are self-aligned to the second trenches 36, and have a second conductivity type (e.g. N type) that is different from a first conductivity type of the substrate (e.g. P type). In order to get the source regions 46 to extend across the isolation regions 24, the ion implant is a deep implant or the STI insulation material is removed from the isolation region portions of the second trenches 36 before the implantation. The resulting structure is shown in FIG. 2D.

An insulation layer 48 is then formed on the structure, including on the sidewalls and bottom of second trenches 36. Insulation layer 48 could be formed of sublayers of differing materials. In a preferred embodiment, layer 48 is an ONO (oxide-nitride-oxide) layer having oxide, nitride, and oxide sublayers. A thick conductive layer (e.g. poly) is then formed over the structure, followed by a poly etch (e.g. a poly CMP etch and poly etch back) which removes that poly layer except for poly blocks 50 at the bottom of second trenches 36. The resulting structure is shown in FIG. 2E.

Figure 2F:
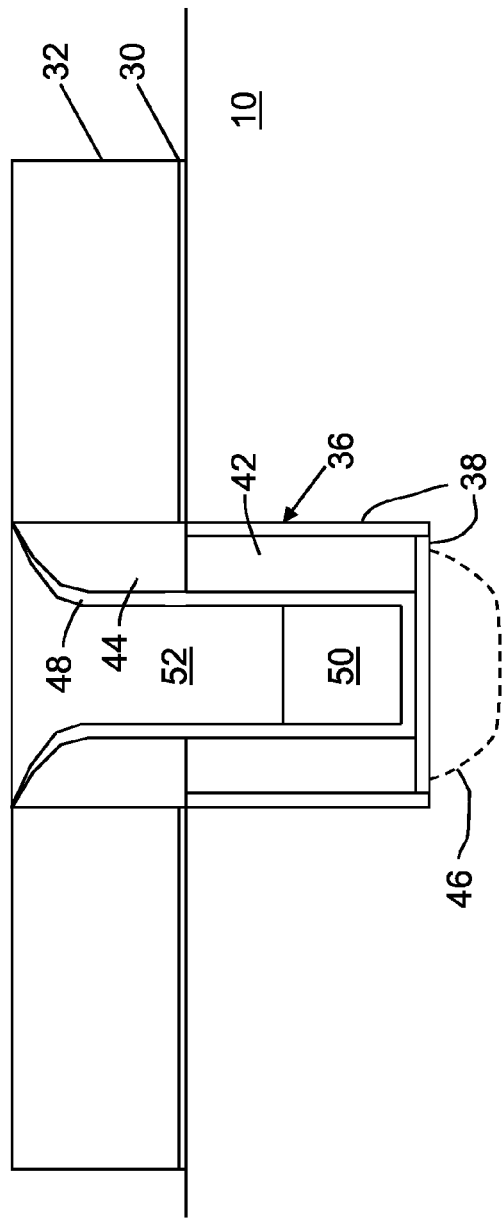
Figure 2G:
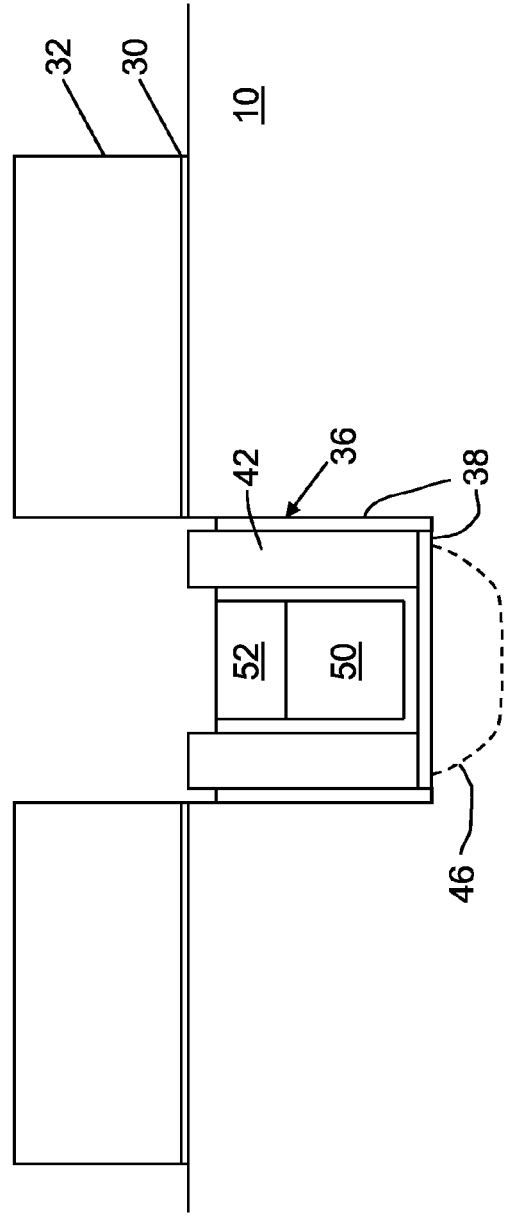
Figure 2H:
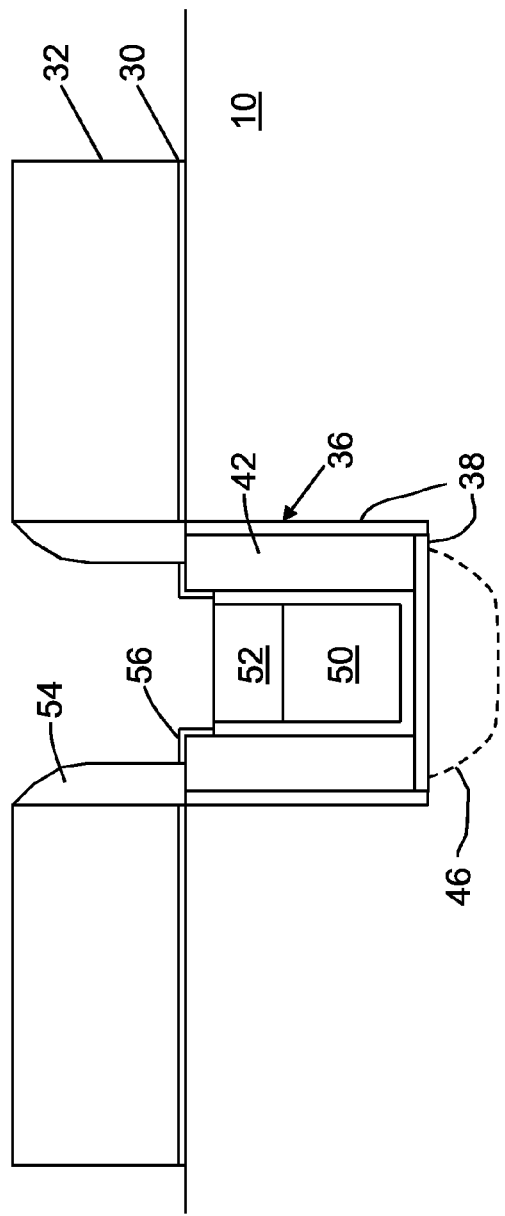

A thick layer of insulation material (e.g. oxide) is deposited over the structure, followed by an oxide CMP etch to remove the oxide layer (and portions of layer 48 outside of second trenches 36) resulting in filling the upper portions of second trenches 36 with oxide 52, as shown in FIG. 2F. An oxide etch back is used to remove the oxide 52, layer 48 and spacers 44 in the upper portions of trenches, exposing the top portions of poly blocks 42, as illustrated in FIG. 2G. Then, an oxide deposition process is performed, followed by an oxide etch, to form oxide spacers 54 along the sidewalls of second trenches 36. Oxide formation is used to form oxide layer 56 over the exposed portions of poly blocks 42. Layer 56 can be formed using a high quality oxide chemical vapor deposition (CVD) process. Alternately, oxide layer 56 can be formed using a high-temperature thermal oxidation (HTO) process, where layer 56 is only formed on exposed portions of poly blocks 42, as shown in FIG. 2H.

Figure 2I:
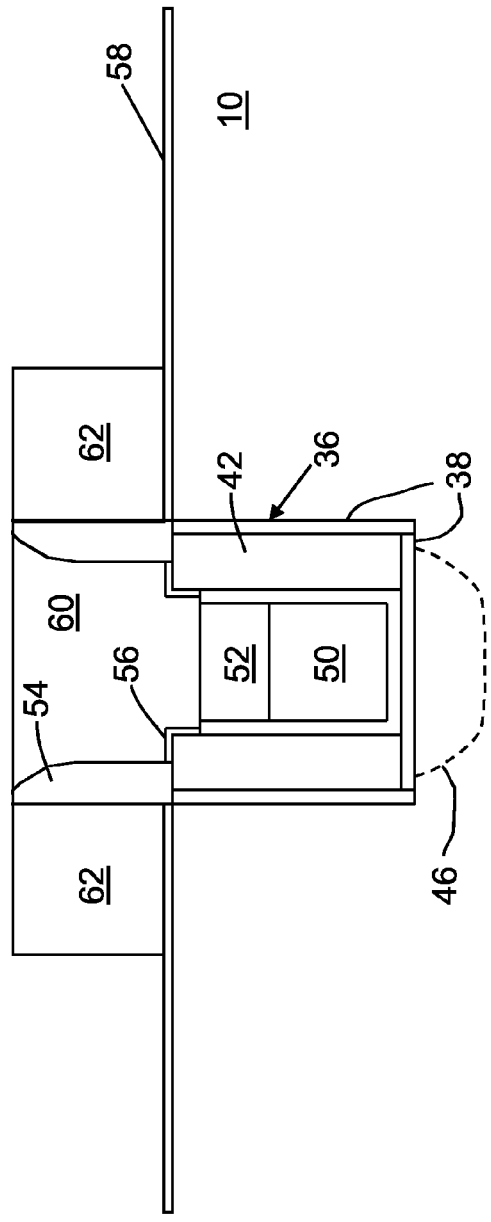

Nitride and oxide etches are performed to remove nitride 32 and oxide 30. An optional lithographic process can be performed to preserve oxide 56 in trenches 36. Alternately, nitride 32 can be removed before the formation of oxide 56. A P-Type ion implantation is used to form the control (or WL) transistor for the memory cell. A thermal oxidation is performed to form a gate oxide layer 58 on the exposed portions of substrate 10 (to a thickness of 15 Å~70 Å). A thick poly layer is deposited over the structure (i.e. on oxide layer 58 and in trench 36). In-situ phosphorus or arsenic doping can be performed, or alternately a poly implant and anneal process can be used. A poly planarization etch is performed to planarize the top of the poly layer. A photolithography and poly etch process is used to remove portions of the poly layer, leaving poly block 60 in trench 36 and poly blocks 62 on gate oxide layer 58 outside of trench 36 and adjacent oxide spacers 54, as illustrated in FIG. 2I.

An oxide etch is then used to remove the exposed portions of oxide layer 58. An oxide deposition and anisotropic etch are used to form oxide spacers 64 on the outer sides of poly blocks 62. Suitable ion implantation (and anneal) is used to form second (drain) regions 66 in the substrate. Insulation material 68, such as BPSG or oxide, is then formed over the entire structure. A masking step is performed to define etching areas over the drain regions 66. The insulation material 68 is selectively etched in the masked regions to create contact openings that extend down to drain regions 66. The contact openings are then filled with a conductor metal (e.g. tungsten) to form metal contacts 70 that are electrically connected to drain regions 66. The final active region memory cell structure is illustrated in FIG. 2J.

Figure 2J:
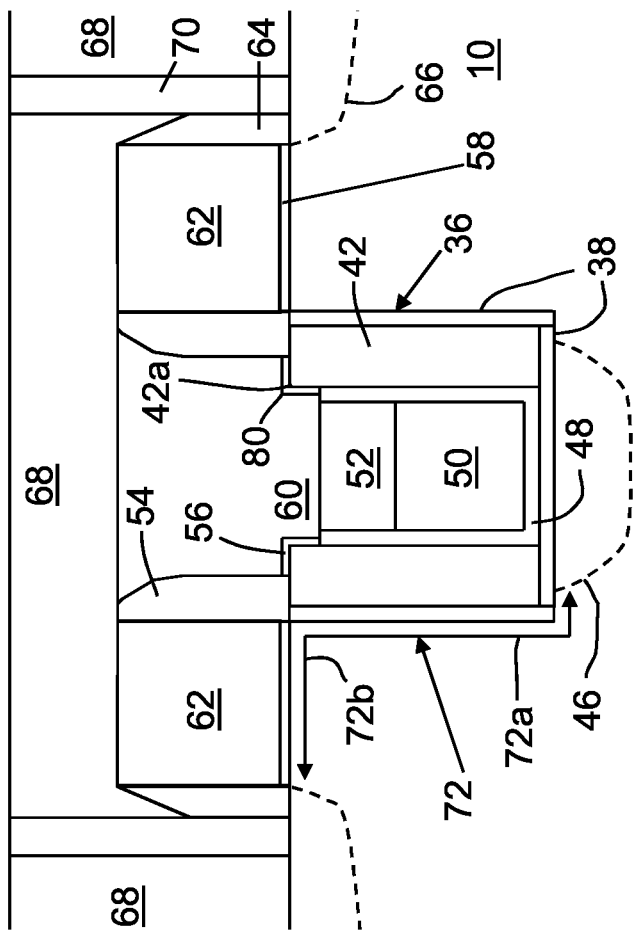

As shown in FIG. 2J, the process of the present invention forms pairs of memory cells that mirror each other, with a memory cell formed on each side of the oxide block 48. For each memory cell, first and second regions 46/66 form the source and drain regions respectively (although those skilled in the art know that source and drain can be switched during operation). Poly block 42 constitutes the floating gate, poly block 50 constitutes the coupling gate, poly block 60 constitutes the erase gate, and poly block 62 constitutes the word line (control) gate. Channel regions 72 for each memory cell are defined in the surface portions of the substrate that is in-between the source and drain 46/66. Each channel region 72 includes two portions joined together at an approximate right angle, with a first (vertical) portion 72a extending along the vertical wall of filled second trench 36 and a second (horizontal) portion 72b extending between the sidewall of filled second trench 36 and the drain region 66. Each pair of memory cells share a common source region 46 that is disposed under filled second trench 36 (and under floating gates 42 and coupling gate 50). Similarly, each drain region 66 is shared between adjacent memory cells from different mirror sets of memory cells. In the array of the memory cells shown in FIG. 2J, coupling gates 50 are continuously formed as control lines that extend across both the active and isolation regions 22/24.

The floating gates 42 are disposed in second trenches 36, with each floating gate facing and insulated from one of the channel region vertical portions 72a, and over one of the source regions 46. Each floating gate 42 includes an upper portion that has a corner edge 42a that faces (and is insulated from) a notch 80 of erase gate 60, thus providing a path for Fowler-Nordheim tunneling through oxide layer 56 to erase gate 60.

Memory Cell Operation

The operation of the memory cells will now be described. The operation and the theory of operation of such memory cells are also described in U.S. Pat. No. 5,572,054, whose disclosure is incorporated herein by reference with regard to the operation and theory of operation of a non-volatile memory cell having a floating gate, gate to gate tunneling, and an array of memory cells formed thereby. The final structure is a pair of memory cells sharing a common source region 46. The control (wordline) gate 62 is formed over the substrate to control the horizontal portion 72b of the channel region 72 underneath. The floating gate 42 is disposed in second trench 36 for controlling the vertical portion 72a of the channel region 72 (along the sidewall of the trench 36). The erase gate 60 includes a notch 80 that extends around the edge 42a of the floating gate 42. The coupling gate 50 is disposed in the trench 36 and is insulated from both the floating gate 42 and the source region 46. Preferably, the thickness of the insulation under the coupling gate 50 (which constitutes insulation layers 38 and 48) is greater than the thickness of the insulation under the floating gate 42 (which constitutes just insulation layer 38).

To erase a selected memory cell in any given active region 22, a high-positive voltage is applied to its erase gate 60. Electrons on the floating gate 42 are induced through the Fowler-Nordheim tunneling mechanism to tunnel from the corner edge 42a of floating gate 42, through the oxide layer 56, and onto the erase gate 60, leaving the floating gate 42 positively charged. Tunneling is enhanced by the sharpness of corner edge 42a, and the fact that edge 42a faces a notch 80 formed in the erase gate 60. The notch 80 results from the erase gate 60 having a lower portion that is narrower in width than its upper portion, and that it extends into the top portion of second trench 36 so as to wrap around corner edge 42a. It should be noted that since each erase gate 60 faces a pair of floating gates 42, both floating gates 42 in each pair will be erased at the same time.

When a selected memory cell is desired to be programmed, a small voltage is applied to its drain region 66. Positive voltages are applied to its control gate 62, coupling gate 50, source region 46 and erase gate 60. Because the floating gate 42 is highly capacitively coupled to the source region 46, coupling gate 50 and erase gate 60, the floating gate 42 "sees" a voltage potential. Electrons generated by the drain region 66 will flow from that region towards the source region 46 through the deeply depleted horizontal portion 72b of the channel region 72. As the electrons reach the vertical portion 72a of the channel region 72, they will see the high potential of floating gate 42 (because the floating gate 42 is strongly voltage-coupled to the positively charged source region 46, coupling gate 50 and erase gate 60). The electrons will accelerate and become heated, with most of them being injected into and through the insulating layer 38 and onto the floating gate 42, thus negatively charging the floating gate 42. A Vcc or ground potential is applied to the source/drain regions 46/66, coupling gates 50 and control gates 62 for memory cell rows/columns not containing the selected memory cell. Thus, only the memory cell in the selected row and column is programmed.

The injection of electrons onto the floating gate 42 will continue until the reduction of the charge on the floating gate 42 can no longer sustain a high surface potential along the vertical channel region portion 72a to generate hot electrons. At that point, the electrons or the negative charges in the floating gate 42 will decrease the electron flow from the drain region 66 onto the floating gate 42.

Finally, to read a selected memory cell, ground potential is applied to its source region 46. A read voltage is applied to its drain region 66, and a Vcc voltage is applied to its control gate 62. If the floating gate 42 is positively charged (i.e. the floating gate is discharged of electrons), then the vertical channel region portion 72a (adjacent to the floating gate 42) is turned on (i.e. conductive). When the control gate 62 is raised to the read potential, the horizontal channel region portion 72b (adjacent the control gate 62) is also turned on. Thus, the entire channel region 72 will be turned on, causing electrons to flow from the source region 46 to the drain region 66. This sensed electrical current would be the "1" state.

On the other hand, if the floating gate 42 is negatively charged, the vertical channel region portion 72a is either weakly turned on or is entirely shut off. Even when the control gate 62 and the drain region 66 are raised to their read potentials, little or no current will flow through vertical channel region portion 72a. In this case, either the current is very small compared to that of the "1" state or there is no current at all. In this manner, the memory cell is sensed to be programmed at the "0" state. Ground potential is applied to the source/drain regions 46/66 and control gates 62 for non-selected columns and rows so only the selected memory cell is read.

One advantage of the memory cell of FIG. 2J is that the coupling gate 50 in the trench 36 can be operated at a high voltage (for capacitive coupling to the floating gate 42 during program or read) while the source can be operated at lower (or different) voltages. Exemplary voltages for erase, read and program are illustrated in Table 1 below for word-line 62, bit line 66, coupling gate 50, erase gate 60 and source line 46:

TABLE 1

|  | Word-line (WL) | | Bit-line (BL) | | Coupling Gate (CG) | | Erase Gate (EG) | | Source-line (Vss) | |
| --- | --- | --- | --- | --- | --- | --- | --- | --- | --- | --- |
|  | Sel. | Uns. | Sel. | Uns. | Sel. | Uns. | Sel. | Uns. | Sel. | Uns. |
| Erase | 0 V | 0 V | 0 V | 0 V | 0 V | 0 V | ~12 V (Vee) | 0 V | 0 V | 0 V |
| Read | Vcc (Vgr) | 0 V | ~0.6 (Vdr) | 0 V | Vcc (Vcgr) | Vcc | Vcc/0 V | Vcc/0 V | 0 V | 0 V |
| Program | ~0.8 V (Vgp) | 0 V | 1.0 μA (Idp) | Vcc (Vinh) | ~10 V (Vcgp) | 0/Vcc | ~4.5 V (Vegp) | 0 V | ~4.5 V (Vslp) | 0 V |

In this exemplary embodiment, during program, source 46 can be placed at 4.5 V while coupling gate 50 is placed at 10 V (i.e. relying on coupling gate 50 for higher voltage capacitive coupling to floating gate 42). Similarly, during read, source 46 is placed at 0 V while coupling gate 50 is placed at Vcc.

In an alternate embodiment, a negative voltage can be employed on the coupling gate 50 during erase, which allows the high voltage on the erase gate to be scaled down to 9 volts (from 12 volts), as illustrated in the Table 2 below:

TABLE 2

|  | Word-line (WL) | | Bit-line (BL) | | Coupling Gate (CG) | | Erase Gate (EG) | | Source-line (Vss) | |
| --- | --- | --- | --- | --- | --- | --- | --- | --- | --- | --- |
|  | Sel. | Uns. | Sel. | Uns. | Sel. | Uns. | Sel. | Uns. | Sel. | Uns. |
| Erase | 0 V | 0 V | 0 V | 0 V | ~−9.0 V | 0 V | ~9 V (Vee) | 0 V | 0 V | 0 V |

TABLE 2-continued

| | Word-line (WL) | | Bit-line (BL) | | Coupling Gate (CG) | | Erase Gate (EG) | | Source-line (Vss) | |
|---|---|---|---|---|---|---|---|---|---|---|
| | Sel. | Uns. | Sel. | Uns. | Sel. | Uns. | Sel. | Uns. | Sel. | Uns. |
| Read | Vcc (Vgr) | 0 V | ~0.6 (Vdr) | 0 V | Vcc (Vcgr) | Vcc | Vcc/0 V | Vcc/0 V | 0 V | 0 V |
| Program | ~0.8 V (Vgp) | 0 V | 1.0 µA (Idp) | Vcc (Vinh) | ~9 V (Vcgp) | 0/Vcc | ~9 V (Vegp) | 0 V | ~4.5 V (VsIp) | 0 V |

Another advantage of the method of forming the memory cells described above is that the control gates 62 and erase gates 60 are formed using the same poly layer and poly layer formation step for better control and manufacturing efficiency. However, separate poly deposition steps could instead be used to separately form the control and erase gates. For example, starting with the structure of FIG. 2H, a poly deposition and CMP etch-back can be performed to fill the tops of trench 36 with poly block 60. A protective oxide layer can then be formed over the poly block 60. Then, the removal of nitride 32 and oxide 30, the ion implant, and the formation of the gate oxide 58 as described above is performed. A thick poly layer is then formed over the structure, followed by a poly etch to form the poly blocks 62 as spacers. The structure is then processed as described above to complete the memory cells.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program, read and erase efficiencies. Memory cell size is reduced significantly because the source regions 46 are buried inside the substrate 10, and are self-aligned to the second trenches 36, where space is not wasted due to limitations in the lithography generation, contact alignment and contact integrity. Each floating gate 42 has a lower portion disposed in second trench 36 formed in the substrate for receiving the tunneling electrons during the program operation and for turning on the vertical channel region portion 72a during the read operation. Each floating gate 42 also has an upper portion terminating in a corner edge 42a facing the notch portion 80 of the erase gate 60 for Fowler Nordheim tunneling thereto during the erase operation. Erase efficiency is enhanced by notch 80 of erase gate 60 that wraps around the corner edge 42a.

Also with the present invention, having source region 46 and drain region 66 separated vertically as well as horizontally allows for easier optimization of reliability parameters without affecting cell size. Further, by providing an erase gate 60 that is separate from the control gate 62, the control gate need only be a low voltage device. This means that high voltage drive circuitry need not be coupled to control gates 62, control gate 62 can be separated further from floating gate 42 for reduced capacitive coupling there between, and that the oxide layer 58 insulating the control gate 62 from the substrate 10 can be thinner given the lack of high voltage operation of the control gate 62. The memory cells can be formed using just two poly deposition steps, the first for forming the floating gates and the second for forming the control and erase gates. Finally, by providing an independent coupling gate 50 in the trench, insulated from the source region 46 with thicker insulation than that insulating floating gate 42 from the source region 46, better performance is achieved, and lower coupling voltages on the source, erase gate and control gate can be utilized.

It is to be understood that the present invention is not limited to the embodiment(s) described above and illustrated herein, but encompasses any and all variations falling within the scope of the appended claims. For example, trenches 20/36 can end up having any shape that extends into the substrate, with sidewalls that are or are not oriented vertically, not just the elongated rectangular shape shown in the figures. Also, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material having etch properties that differ from that of silicon dioxide (or any insulator) and from polysilicon (or any conductor) can be used. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Single layers of insulating or conductive material could be formed as multiple layers of such materials, and vice versa. The top surfaces of floating gates 42 may extend above, or can be recessed below, the substrate surface. Lastly, while notches 80 surrounding floating gate edges 42a are preferable, they are not necessarily mandatory, as it is possible to implement erase gate 60 without notches 80 (e.g. where the lower portion of erase gate 60 is simply laterally adjacent to or vertically adjacent to (and insulated from) floating gate 42.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A pair of memory cells, comprising:
   a substrate of semiconductor material having a first conductivity type and a surface;
   a trench formed into the surface of the substrate and including a pair of opposing sidewalls;
   a first region formed in the substrate under the trench;
   a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface;
   a pair of electrically conductive floating gates each at least partially disposed in the trench adjacent to and insulated from one of the channel region first portions for controlling a conductivity of the one channel region first portion, and over and insulated from the first region;
   an electrically conductive erase gate having a lower portion disposed in the trench and disposed adjacent to and insulated from the floating gates;
   an electrically conductive coupling gate disposed in the trench, disposed between and insulated from the floating gates, disposed over and insulated from the first region, and disposed under and insulated from the erase gate; and
   a pair of electrically conductive control gates each disposed over and insulated from one of the channel region second portions for controlling a conductivity of the one channel region second portion.

2. The pair of memory cells of claim 1, wherein the coupling gate is insulated from the first region by thicker insulation material than are the floating gates.

3. The pair of memory cells of claim 1, wherein:
   the coupling gate is insulated from the first region by insulation material having a total first thickness;
   the floating gates are insulated from the first region by insulation material having a total second thickness; and
   the first thickness is greater than the second thickness.

4. The pair of memory cells of claim 1, wherein there is no vertical overlap between the pair of control gates and the pair of floating gates.

5. The pair of memory cells of claim 1, wherein the erase gate is disposed adjacent to the floating gates and insulated therefrom with insulation material having a thickness that permits Fowler-Nordheim tunneling.

6. The pair of memory cells of claim 1, wherein the erase gate includes a pair of notches and each of the floating gates includes an edge that directly faces and is insulated from one of the pair of notches.

7. The pair of memory cells of claim 6, wherein the erase gate includes an upper portion having a first width, and wherein the erase gate lower portion has a second width that is less than the first width.

8. The pair of memory cells of claim 7, wherein the pair of notches are disposed where the upper and lower portions of the erase gate meet.

9. A method of forming a pair of memory cells, comprising:
   forming a trench into a surface of the semiconductor substrate of first conductivity type, wherein the trench has a pair of opposing sidewalls;
   forming a first region in the substrate and under the trench;
   forming a pair of second regions in the substrate, with a pair of channel regions each defined in the substrate between the first region and one of the second regions, wherein the first and second regions have a second conductivity type, and wherein each of the channel regions includes a first portion that extends substantially along one of the opposing trench sidewalls and a second portion that extends substantially along the surface of the substrate;
   forming a pair of electrically conductive floating gates each at least partially disposed in the trench adjacent to and insulated from one of the channel region first portions for controlling a conductivity of the one channel region first portion;
   forming an electrically conductive erase gate having a lower portion disposed in the trench and disposed adjacent to and insulated from the floating gates;
   forming an electrically conductive coupling gate disposed in the trench, disposed between and insulated from the floating gates, disposed over and insulated from the first region, and disposed under and insulated from the erase gate; and
   forming a pair of electrically conductive control gates each disposed over and insulated from one of the channel region second portions for controlling a conductivity of the one channel region second portion.

10. The method of claim 9, wherein the coupling gate is insulated from the first region by thicker insulation material than are the floating gates.

11. The method of claim 9, wherein:
    the coupling gate is insulated from the first region by insulation material having a total first thickness;
    the floating gates are insulated from the first region by insulation material having a total second thickness; and
    the first thickness is greater than the second thickness.

12. The method of claim 9, wherein there is no vertical overlap between the pair of control gates and the pair of floating gates.

13. The method of claim 9, wherein the erase gate includes a pair of notches and each of the floating gates includes an edge that directly faces and is insulated from one of the pair of notches.

14. The method of claim 13, wherein the formation of the erase gate comprises:
    forming an upper portion of the erase gate having a first width; and
    forming the lower portion of the erase gate having a second width that is less than the first width.

15. The method of claim 14, wherein the pair of notches are disposed where the upper and lower portions of the erase gate meet.

16. The method of claim 9, further comprising:
    forming a sacrificial layer of oxide on the opposing sidewalls of the trench; and
    removing the sacrificial layer of oxide.

17. The method of claim 9, wherein the formation of the floating gates comprises:
    forming conductive material in the trench;
    forming a pair of opposing spacers of insulation material on the conductive material such that a portion of the conductive material is exposed between the pair of opposing spacers; and
    removing the exposed portion of the conductive material.

18. The method of claim 17, wherein the removing of the exposed portion of the conductive material comprises an anisotropic etch.

19. The method of claim 17, wherein the formation of the erase and control gates comprises:
   forming a layer of conductive material having a first portion disposed between the opposing spacers, and second and third portions disposed over the substrate surface with the opposing spacers disposed there between.

20. A method of programming one of a pair of memory cells, whereby the pair of memory cells comprise a substrate of semiconductor material having a first conductivity type and a surface, a trench formed into the surface of the substrate and including a pair of opposing sidewalls, a first region formed in the substrate under the trench, a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each at least partially disposed in the trench adjacent to and insulated from one of the channel region first portions for controlling a conductivity of the one channel region first portion, an electrically conductive erase gate having a lower portion disposed in the trench and disposed adjacent to and insulated from the floating gates, an electrically conductive coupling gate disposed in the trench, disposed between and insulated from the floating gates, disposed over and insulated from the first region, and disposed under and insulated from the erase gate, and a pair of electrically conductive control gates each disposed over and insulated from one of the channel region second portions for controlling a conductivity of the one channel region second portion, the method comprising:
   applying a positive voltage to one of the second regions;
   applying a positive voltage to one of the control gates;
   applying a positive voltage to the first region;
   applying a positive voltage to the coupling gate; and
   applying a positive voltage to the erase gate;
   wherein the positive voltage applied to the first region is different from the positive voltage applied to the coupling gate.

21. The method of claim 20, wherein the positive voltage applied to the coupling gate is greater than the positive voltage applied to the first region.

22. A method of erasing a pair of memory cells, whereby the pair of memory cells comprise a substrate of semiconductor material having a first conductivity type and a surface, a trench formed into the surface of the substrate and including a pair of opposing sidewalls, a first region formed in the substrate under the trench, a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each at least partially disposed in the trench adjacent to and insulated from one of the channel region first portions for controlling a conductivity of the one channel region first portion, an electrically conductive erase gate having a lower portion disposed in the trench and disposed adjacent to and insulated from the floating gates, an electrically conductive coupling gate disposed in the trench, disposed between and insulated from the floating gates, disposed over and insulated from the first region, and disposed under and insulated from the erase gate, and a pair of electrically conductive control gates each disposed over and insulated from one of the channel region second portions for controlling a conductivity of the one channel region second portion, the method comprising:
   applying a negative voltage to the coupling gate; and
   applying a positive voltage to the erase gate.

* * * * *